(12) United States Patent
Weizman et al.

(10) Patent No.: US 9,671,456 B2
(45) Date of Patent: Jun. 6, 2017

(54) SEMICONDUCTOR DEVICE ARRANGEMENT, A METHOD OF ANALYSING A PERFORMANCE OF A FUNCTIONAL CIRCUIT ON A SEMICONDUCTOR DEVICE AND A DEVICE ANALYSIS SYSTEM

(75) Inventors: Yoav Weizman, Kfar-Vitkin (IL); Jacob Fridburg, Gan Yavne (IL); Shai Shperber, Bat Hefer (IL)

(73) Assignee: NXP USA, Inc., Austin, TX (US)

( * ) Notice: Subject to any disclaimer, the term of this patent is extended or adjusted under 35 U.S.C. 154(b) by 121 days.

(21) Appl. No.: 14/395,707

(22) PCT Filed: Apr. 23, 2012

(86) PCT No.: PCT/IB2012/052024
§ 371 (c)(1),
(2), (4) Date: Oct. 20, 2014

(87) PCT Pub. No.: WO2013/160723
PCT Pub. Date: Oct. 31, 2013

(65) Prior Publication Data
US 2015/0104886 A1    Apr. 16, 2015

(51) Int. Cl.
*G01R 31/28* (2006.01)
*G01R 31/317* (2006.01)
*G01R 31/308* (2006.01)
*H01L 21/66* (2006.01)

(52) U.S. Cl.
CPC ....... *G01R 31/2882* (2013.01); *G01R 31/308* (2013.01); *G01R 31/31725* (2013.01); *H01L 22/12* (2013.01); *H01L 22/20* (2013.01); *H01L 22/34* (2013.01)

(58) Field of Classification Search
None
See application file for complete search history.

(56) References Cited

U.S. PATENT DOCUMENTS

| 6,084,267 | A | 7/2000 | Petrosino |
| 6,154,074 | A | 11/2000 | Nakashima |
| 6,469,514 | B2 | 10/2002 | Okayasu |
| 6,967,491 | B2 | 11/2005 | Perdu et al. |

(Continued)

OTHER PUBLICATIONS

International Search Report and Written Opinion correlating to PCT/IB2012/052024 dated Dec. 26, 2012.

(Continued)

*Primary Examiner* — Jermele M Hollington
*Assistant Examiner* — Douglas X Rodriguez

(57) ABSTRACT

A semiconductor device arrangement comprising a functional circuit comprising a plurality of timing components and a reference module comprising a plurality of reference components is described. Each reference component comprises a reference timing component corresponding to a timing component of the plurality of timing components and a controllable timing component. The controllable timing component is arranged to provide a delay in dependence on an applied light stimulus. A method of analyzing a performance of a functional circuit on a semiconductor device is also described. A device analysis system for analyzing a functional circuit comprising a plurality of timing components is also described.

14 Claims, 3 Drawing Sheets

(56) References Cited

U.S. PATENT DOCUMENTS

| | | |
|---|---|---|
| 7,872,489 B2 | 1/2011 | Dickson et al. |
| 8,081,003 B2 | 12/2011 | Pacha et al. |
| 8,384,406 B2 * | 2/2013 | Watanabe ........ G01R 31/31928 324/750.01 |
| 2004/0064722 A1 | 4/2004 | Neelay et al. |
| 2006/0123296 A1 | 6/2006 | Reichert |
| 2013/0314116 A1 * | 11/2013 | Vedagarbha ......... G01R 31/311 324/754.23 |

OTHER PUBLICATIONS

Rowlette, Jeremy A. et al: "Critical Timing Analysis in Microprocessors Using Near-IR Laser Assisted Device Alteration (LADA)", ITC International Test Conference, 0-7803-8106-8/03, IEEE 2003, pp. 264-273.

\* cited by examiner

SEMICONDUCTOR DEVICE ARRANGEMENT, A METHOD OF ANALYSING A PERFORMANCE OF A FUNCTIONAL CIRCUIT ON A SEMICONDUCTOR DEVICE AND A DEVICE ANALYSIS SYSTEM

FIELD OF THE INVENTION

This invention relates to a semiconductor device arrangement, a method of analysing a performance of a functional circuit on a semiconductor device, a method of adapting a functional circuit on a semiconductor device, and a device analysis system.

BACKGROUND OF THE INVENTION

An important point of attention in design and test of semiconductor devices is given to the timing behaviour of the semiconductor device and its components. A semiconductor device typically has a functional circuit formed from a plurality of functional components which are connected to form a plurality of signal paths. A plurality of appropriately designed buffers and other timing components is usually required on these signal paths to hold, delay or otherwise synchronize the signals on these signal paths, and thereby improve the performance of the functional circuit. Design and test hereto involves iterations of design cycles and test cycles, involving device simulation and testing of a manufactured semiconductor device. Different methods exist to identify the critical timing paths, but these methods run into their limits, especially with increasing operating frequencies of functional circuits on semiconductor devices and with modern semiconductor device designs wherein it may be difficult to access some of the components of the functional circuit. Analysis of the performance limiting factors of the functional circuit and especially the critical paths thereon, and/or the design of an improved functional circuit may thereby be hampered when using known methods.

SUMMARY OF THE INVENTION

The present invention provides a semiconductor device arrangement, a method of analysing a performance of a functional circuit on a semiconductor device, a method of adapting a functional circuit on a semiconductor device and a device analysis system as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

Figure 1:
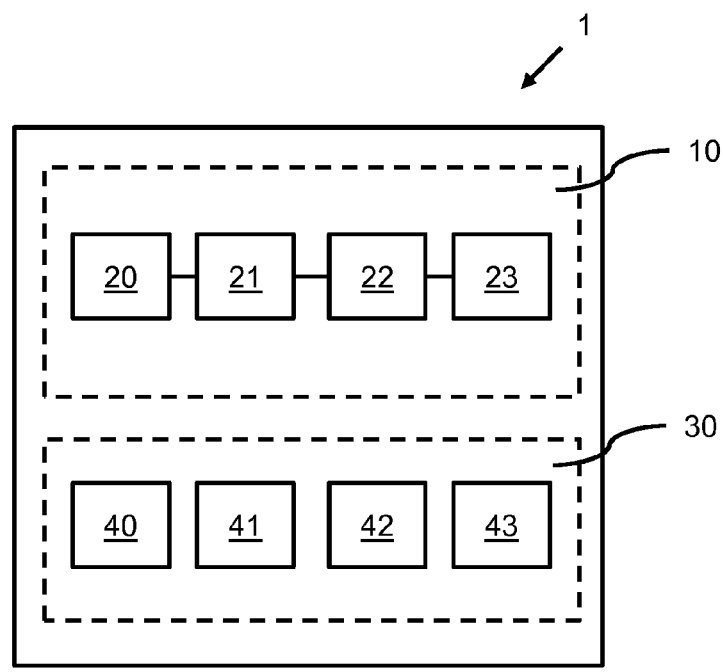
FIG. 1 schematically shows an example of an embodiment of a semiconductor device arrangement.
Figure 2:
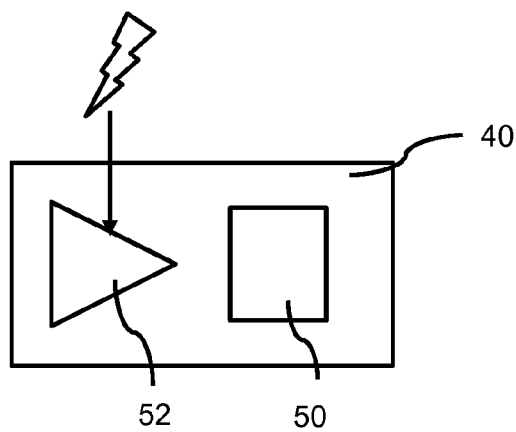
FIG. 2 and FIG. 3 schematically show details of examples of embodiments.

FIG. 1 schematically shows an example of an embodiment of a semiconductor device arrangement 1. The semiconductor device arrangement 1 comprises a functional circuit 10 and a reference module 30 arranged on a single semiconductor device. In an alternative embodiment (not shown in the figure), the functional circuit is arranged on one semiconductor device and the reference module is arranged on another semiconductor device. The functional circuit 10 comprises a plurality of timing components 20, 21, 22, 23. The reference module 30 comprises a plurality of reference components 40, 41, 42, 43. Each reference component 40, 41, 42, 43 comprises a reference timing component 50 and a controllable timing component 52, as indicated for reference component 40 in FIG. 2. The reference timing component 50 of reference component 40 corresponds to a timing component of timing component 20 of the plurality of timing components. Each reference timing component 50 may thus be referred to as being representative for one of the timing components of the functional circuit. Each reference component 40, 41, 42, 43 may further be referred to as a controllable timing representative of one of the timing components of the functional circuit. Each controllable timing component is arranged to provide a delay in dependence on an applied light stimulus. The controllable timing component may e.g. be a timing structure as described on page 269 in relation to its FIG. 11 of the article "Critical Timing Analysis in Microprocessors Using Near-IR Laser Assisted Device Alteration (LADA)" by Jeremy A. Rowlette and Travis M. Eiles in ITC International Test Conference, 0-7803-8106-8/03, page 264-273 (hereafter: Rowlette et al), showing a change in signal delay of about 0 to −40 ps for the rising edge and about 0 to +50 ps for the falling edge when a laser pulse of 1064 nm wavelength and of varying power is applied as a light stimulus to the timing structure. Alternative controllable timing components, known in the art, may also be used.

Figure 3:
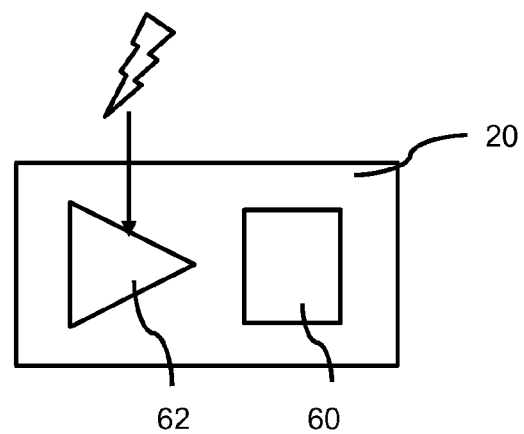

FIG. 3 schematically shows one of the timing components 20 of the functional circuit 10. The shown timing component 20 comprises a further controllable timing component 62. The further controllable timing component is arranged to provide a delay in dependence on an applied light stimulus, in a similar manner as controllable timing component 52 of reference component 40 in FIG. 2.

Figure 4:
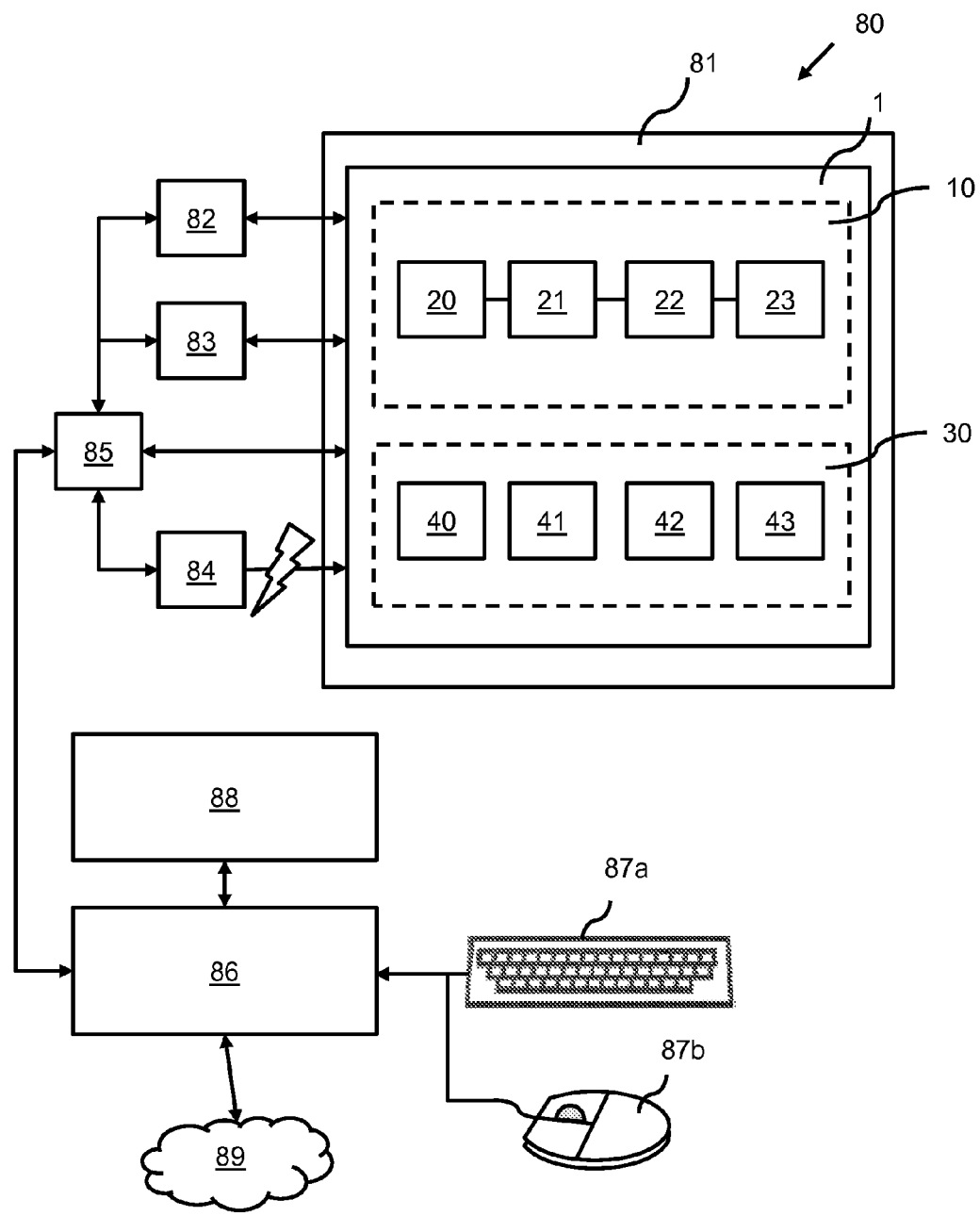
FIG. 4 shows a device analysis system according to an embodiment.

FIG. 4 shows a device analysis system 80 according to an embodiment together with the semiconductor device arrangement 1 described above. The device analysis system 80 has a test position 81. FIG. 4 shows the device analysis system 80 during use: the semiconductor device arrangement 1, comprising the functional circuit 10 to be analysed and the reference module 30, is received at a test position 81 of the device analysis system 80. The device analysis system 80 further has a testing unit 82, an inspection unit 83, an optical source 84 and a timing analysis unit 85. The device analysis system 80 is connected, via the timing analysis unit 85, to a computer arrangement 86 that is operable by a user. The computer arrangement 86 is provided with input devices such as a keyboard 87a and a mouse 87b for taking user instructions and user data from the user, a display 88 for presenting information to the user, and connected to a cloud 89 for communicating with external devices. The cloud 89 may e.g. be the internet or a local area network. The user can use the computer arrangement 86 to operate the device analysis system 80 and thereby operate the functional circuit 10 with an operation condition via the testing unit 82 and inspect the functional circuit during operation via the inspection unit 83. In the example, the inspection unit 83 cooperates with the optical source 84 to inspect the functional circuit with a scanning laser beam provided by the optical source and to detect light reflected from the semiconductor device arrangement 1 with a camera of the inspection unit 83. The inspection unit 83 is arranged to identify a critical timing path of the functional circuit from the inspection and to identify one timing component of the plurality of timing components 20, 21, 22, 23 of the functional circuit 10 as the critical timing component. The inspection unit 83 and the timing analysis unit 85 cooperate to identify one of the plurality of reference components 40, 41, 42, 43 to correspond to the critical timing component as a representative reference component. The testing unit 82 may then be used to operate the representative reference component with a reference operation condition corresponding to the operation condition of the functional circuit. The optical source 84 is arranged to apply a plurality of light stimuli to the representative reference component, in particular to its controllable timing component 52, whereby the controllable timing component 52 provides a different delay for each different light stimulus. The timing analysis unit 85 is arranged to be electrically connected to the representative reference component and to measure a timing performance of the reference component in dependence on the operating condition and the plurality of light stimuli. The optical source 84 is further arranged to apply 160 a plurality of further light stimuli to the functional circuit 10 for inducing a delay in dependence on these further light stimuli from the further controllable timing component 62 of a timing component of the functional circuit 10.

The inspection unit 83 and the optical source 84 may be arranged to cooperate to perform a laser assisted device alteration (LADA) to the controllable timing component 52 using a LADA-system as described in Rowlette et al, or a similar system.

The user can use the device analysis system 80 together with the computer arrangement 86 to inspect, analyse and improved the functional circuit, e.g. using a method as described below.

Figure 5:
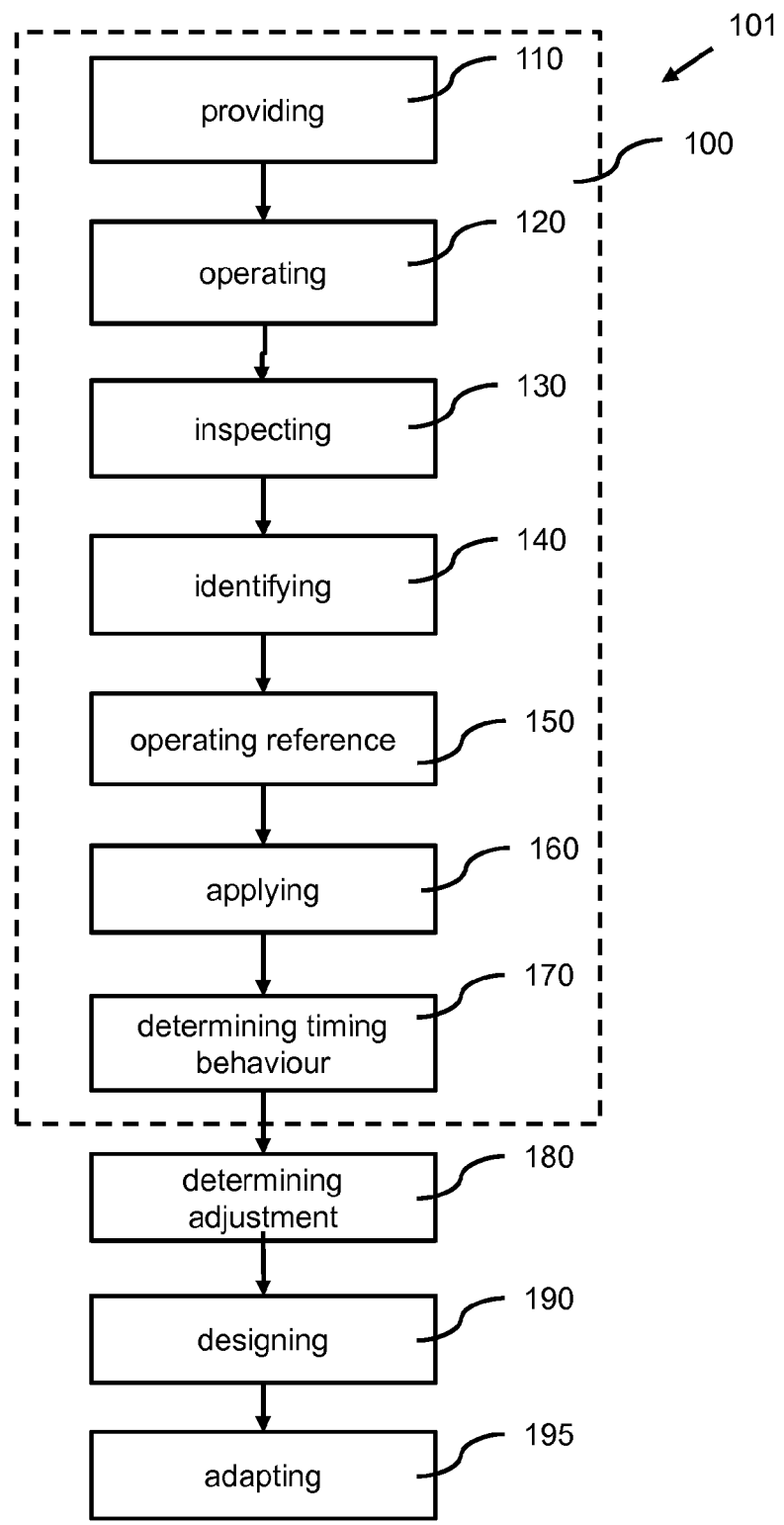
FIG. 5 schematically shows an example of an embodiment of a method.

FIG. 5 schematically shows a method 101 of adapting a functional circuit 10 on a semiconductor device. The embodiment shown relates to improving a performance of the functional circuit 10 on a semiconductor device. The method comprises first performing a method 100 of analysing a performance of the functional circuit to determine a timing behaviour of the representative reference component and then performing the blocks of determining 180 a timing adjustment from the timing behaviour, designing 190 an adapted timing component as the critical timing component adjusted to provide the timing adjustment, and adjusting 195 the functional circuit to include the adapted timing component. The timing adjustment may be determined to provide an optimal tuning performance, such as an optimal robustness against externally induced timing variation or an optimal performance over a pre-determined frequency range.

The method 100 of analysing a performance of the functional circuit comprises providing 110 a semiconductor device arrangement 1, operating 120 the functional circuit of the semiconductor device arrangement with an operation condition and inspecting 130 the functional circuit during operation to identify a critical timing path and to identify at least one of the plurality timing components as a critical timing component on the critical timing path. The inspecting 130 of the functional circuit during operation to identify the critical timing path may comprise an optical inspection with light from e.g. a light source of inspection unit 83. The inspection is e.g. done with light from laser scanning, and may include injection light into the device, e.g. to perform laser assisted device alteration of controllable components of the functional circuit. The method 100 further comprises identifying 140 one of the plurality of reference components to correspond to the critical timing component as a representative reference component, operating 150 the representative reference component with a reference operation condition corresponding to the operation condition of the functional circuit and applying 160 a plurality of light stimuli to the representative reference component. The applying 160 of the plurality of light stimuli may comprise injection of light from e.g. the optical source 84 into the controllable timing component 52 of the representative reference component 50. The method further comprises determining 170 the timing behaviour of the representative reference component in dependence on the reference operating condition and the plurality of light stimuli. The applying of the plurality of light stimuli to the representative reference component may be done using laser assisted device alteration to the controllable timing component of the representative reference component, so as to induce a change in signal propagation delay as a function of laser power, for example due to photocurrent injection as described in Rowlette et al. The determining of the timing behaviour of the representative reference component 50 in dependence on the operating condition and the plurality of light stimuli may use a pre-determined relationship between light stimulus and associated timing delay, such as e.g. a relationship like the one given in FIG. 11 of Rowlette et al when using LADA. The operating 150, and applying 160 may further comprise operating the representative reference component with further reference operation conditions corresponding to the operation condition of the functional circuit at different operation frequencies. The determining 170 the timing behaviour of the representative reference component may then comprise determining the timing behaviour of the representative reference component in dependence on the reference operating condition, the further reference operation conditions, and the plurality of light stimuli. The timing behaviour of the reference component may then be then used in, determining 180 a timing adjustment, e.g. so as to compensate for a clock mismatch in the critical timing path identified in inspection 130 the functional circuit. The timing adjustment as thus determined may then be provided to a designer, optionally together with the timing behaviour as determined. The designer may e.g. compare the timing adjustment, and optionally the timing behaviour, with corresponding results from a design static timing analysis, a full circuit simulation and/or a full layout simulation. The designer may then continue to designing 190 an adapted timing component as the critical timing component adjusted to provide the timing adjustment, and adjusting 195 the functional circuit to include the adapted timing component.

Thus, a first aspect provides a semiconductor device arrangement comprising: a functional circuit comprising a plurality of timing components and a reference module comprising a plurality of reference components. Each reference component comprises a reference timing component corresponding to a timing component of the plurality of timing components and a controllable timing component. The controllable timing component is arranged to provide a delay in dependence on an applied light stimulus. The semiconductor device arrangement hereby allows to identify a critical path during testing. The semiconductor device arrangement may not only allow to determine which timing component is critical, but may also allow to substantially test its timing performance in isolation of the functional circuit by testing the timing performance of the representative reference component. In testing the timing performance of the representative reference component, additional timing delays may be added by applying different light stimuli to the controllable timing component. The performance of the reference timing component, representative of a timing component on the critical path, may hereby be tested in dependence on variation of an additionally applied delay, whereby, effectively, the robustness of the reference timing component to timing variations on the critical path may be tested. The results of such test may be used in a further design cycle of the functional circuit to improve the timing performance of the functional circuit.

The functional circuit and the reference module may be arranged on a single semiconductor device. This may be advantageous e.g. during the design and test phase, as the functional circuit and matching reference module may be tested together on the single device.

In another embodiment, the functional circuit is arranged on a first semiconductor device and the reference module is arranged on a second semiconductor device. This allows separate use of the functional circuit and the reference module, e.g. by different persons in the design and test phase. During commercial production of the first semiconductor device with the functional circuit, the second semiconductor device may be used in e.g. quality monitoring.

In an embodiment, at least one of the plurality of timing components of the functional circuit comprises a further controllable timing component, the further controllable timing component being arranged to provide a delay in dependence on an applied light stimulus. This may allow to also modify the timing behaviour of the timing component in the functional circuit itself, enabling. e.g., to test whether its timing design may become critical in the functional circuit itself when the timing is changed. The further controllable timing component may thus be used to induce e.g. a failure on the critical timing path.

A second aspect provides a method of analysing a performance of a functional circuit on a semiconductor device, the method comprising: providing a semiconductor device arrangement according to an embodiment of the first aspect; operating the functional circuit of the semiconductor device arrangement with an operation condition; inspecting the functional circuit during operation to identify a critical timing path and to identify at least one of the plurality timing components as a critical timing component on the critical timing path; identify one of the plurality of reference components to correspond to the critical timing component as a representative reference component; operating the representative reference component with a reference operation condition corresponding to the operation condition of the functional circuit; applying a plurality of light stimuli to the representative reference component; determining a timing behaviour of the representative reference component in dependence on the reference operating condition and the plurality of light stimuli. The inspecting may e.g. be performed with light, e.g. with laser scanning. Applying each light stimulus may correspond inducing an associated timing delay of the controllable delay component. The timing behaviour of the representative reference component may thus be analysed as a function of difference timing delays applied to the representative reference component, whereby the timing performance of the critical timing component of the functional circuit may effectively be analyzed.

A third aspect provides a method of adapting a functional circuit on a semiconductor device, the method comprising providing a semiconductor device arrangement according to an embodiment of the first aspect; operating the functional circuit of the semiconductor device arrangement with an operation condition; inspecting the functional circuit during operation to identify a critical timing path and to identify at least one of the plurality timing components as a critical timing component on the critical timing path; identify one of the plurality of reference components to correspond to the critical timing component as a representative reference component; operating the representative reference component with a reference operation condition corresponding to the operation condition of the functional circuit; applying a plurality of light stimuli to the representative reference component; determining a timing behaviour of the representative reference component in dependence on the reference operating condition and the plurality of light stimuli; determining a timing adjustment from the timing behaviour; designing an adapted timing component as the critical timing component adjusted to provide the timing adjustment; and adapting the functional circuit to include the adapted timing component. Hereby, the timing performance of the critical timing component of the functional circuit may effectively be analysed, and the design of the critical timing component may be adapted so as to improve the timing performance of the functional circuit. The method of adapting the functional circuit on the functional circuit may thus relate to improving a performance of a functional circuit on semiconductor device. The timing adjustment may e.g. be determined to obtain an optimum timing margin.

A fourth aspect provides a device analysis system for analysing a functional circuit comprising a plurality of timing components, the device analysis system comprising: a test position arranged to receive a semiconductor device arrangement according to an embodiment of the first aspect, the semiconductor device arrangement comprising the functional circuit to be analysed and the reference module; a testing unit arranged to operate the semiconductor device arrangement; an inspection unit arranged to inspect the functional circuit during operation; an optical source arranged to provide a plurality of light stimuli to the semiconductor device arrangement; and a timing analysis unit arranged to measure a timing performance of a reference component in dependence on the operating condition and the plurality of light stimuli. The inspection unit may e.g. be arranged to inspect the functional circuit during operation with light, and comprise a localization unit to identify a critical path and localize a critical timing component on the critical path. The optical source may be arranged to provide the plurality of light stimuli to the representative reference component of the semiconductor device arrangement. The optical source may further be arranged to provide the plurality of light stimuli to a part of the functional circuit of the semiconductor device arrangement during inspection.

In the foregoing specification, the invention has been described with reference to specific examples of embodiments of aspects of the invention. It will, however, be evident that various modifications and changes may be made therein without departing from the broader spirit and scope of the invention as set forth in the appended claims. For example, the connections may be an type of connection suitable to transfer signals from or to the respective nodes, units or devices, for example via intermediate devices.

Accordingly, unless implied or stated otherwise the connections may for example be direct connections or indirect connections.

Some of the above embodiments, as applicable, may be implemented using a variety of different system architectures. For example, although FIG. 4 and the discussion thereof describe an exemplary device analysis system and information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

In one embodiment, system 86 is a computer system such as a personal computer system. Other embodiments may include different types of computer systems. Computer systems are information handling systems which can be designed to give independent computing power to one or more users. Computer systems may be found in many forms including but not limited to mainframes, minicomputers, servers, workstations, personal computers, notepads, personal digital assistants, electronic games, automotive and other embedded systems, cell phones and various other wireless devices. A typical computer system includes at least one processing unit, associated memory and a number of input/output (I/O) devices.

A computer system processes information according to a program and produces resultant output information via I/O devices. A program is a list of instructions such as a particular application program and/or an operating system. A computer program is typically stored internally on computer readable storage medium or transmitted to the computer system via a computer readable transmission medium. A computer process typically includes an executing (running) program or portion of a program, current program values and state information, and the resources used by the operating system to manage the execution of the process. A computer program may comprise instructions to perform one or more method steps of the methods described herein.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device.

Also, devices functionally forming separate devices may be integrated in a single physical device.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A method of analysing a performance of a functional circuit on a semiconductor device arrangement that includes a functional circuit comprising a plurality of timing components, a reference module comprising a plurality of reference components, each reference component comprising a reference timing component corresponding to a timing component of the plurality of timing components and a controllable timing component, the controllable timing component being arranged to provide a delay in dependence on an applied light stimulus, the method comprising:
operating the functional circuit of the semiconductor device arrangement with an operation condition;
inspecting the functional circuit during operation to identify a critical timing path and to identify at least one of the plurality timing components as a critical timing component on the critical timing path;
identifying one of the plurality of reference components to correspond to the critical timing component as a representative reference component;
operating the representative reference component with at least a reference operation condition corresponding to the operation condition of the functional circuit;
applying a plurality of light stimuli to the representative reference component; and
determining a timing behaviour of the representative reference component in dependence on at least the reference operating condition and the plurality of light stimuli.

2. A method according to claim 1, the operating the representative reference component comprising operating the representative reference component with one or more further reference operation conditions corresponding to the operation condition of the functional circuit at different operation frequencies, and determining the timing behaviour of the representative reference component being performed in dependence on at least the reference operating condition, the one or more further reference conditions and the plurality of light stimuli.

3. A method according to claim 1, the inspecting of the functional circuit during operation to identify the critical timing path comprising an optical inspection with light from an optical inspection unit.

4. A method according to claim 3, the applying of the plurality of light stimuli comprising injection of light from the optical inspection unit.

5. A method according to claim 1, the determining of the timing behaviour of the representative reference component in dependence on the operating condition and the plurality of light stimuli using a pre-determined relationship between light stimulus and associated timing delay.

6. A method according to claim 1, the applying of the plurality of light stimuli to the representative reference component using laser assisted device alteration to the controllable timing component of the representative reference component.

7. A method according to claim 1, at least one of the plurality of timing components of the functional circuit comprising a further controllable timing component, the further controllable timing component being arranged to provide a delay in dependence on an applied light stimulus, the inspecting the functional circuit during operation comprising applying a plurality of light stimuli to the further controllable timing component.

8. A method of adapting a functional circuit on a semiconductor device, the method comprising:
performing a method according to claim 1;
determining a timing adjustment from the timing behaviour;
designing an adapted timing component as the critical timing component adjusted to provide the timing adjustment; and
adapting the functional circuit to include the adapted timing component.

9. A device analysis system for analyzing a functional circuit comprising a plurality of timing components, the device analysis system comprising:
a test position arranged to receive a semiconductor device arrangement having the functional circuit to be analyzed and a reference module comprising a plurality of reference components, each reference component comprising a reference timing component corresponding to a timing component of the plurality of timing components of the functional circuit and a controllable timing component, the controllable timing component being arranged to provide a delay in dependence on light stimulus applied to the controllable timing component:
a testing unit arranged to operate the semiconductor device arrangement;
an inspection unit arranged to inspect the functional circuit during operation to identify a critical timing path, to identify at least one of the plurality timing components as a critical timing component on the critical timing path, and to identify one of the plurality of reference components to correspond to the critical timing component as a representative reference component;
an optical source arranged to provide a plurality of light stimuli to the representative reference component; and
a timing analysis unit arranged to measure a timing performance of a reference component in dependence on the operating condition and the plurality of light stimuli.

10. A device analysis system according to claim 9, the functional circuit and the reference module being arranged on a single semiconductor device.

11. A device analysis system according to claim 9, the functional circuit being arranged on a first semiconductor device and the reference module being arranged on a second semiconductor device.

12. A device analysis system according to claim 9, at least one of the plurality of timing components of the functional circuit comprising a further controllable timing component, the further controllable timing component being arranged to provide a delay in dependence on an applied light stimulus.

13. A device analysis system according to claim 9, the optical source being arranged to perform laser assisted device alteration.

14. A device analysis system according to claim 9, the inspection unit comprising the optical source.

* * * * *